(12) United States Patent
Susaki

(10) Patent No.: US 6,769,549 B2
(45) Date of Patent: Aug. 3, 2004

(54) EMBOSSED CARRIER TAPE FOR ELECTRONIC DEVICES

(75) Inventor: Mamoru Susaki, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/755,058

(22) Filed: Jan. 8, 2001

(65) Prior Publication Data

US 2002/0005371 A1 Jan. 17, 2002

(30) Foreign Application Priority Data

Jul. 11, 2000 (JP) .......................................... 2000-209195

(51) Int. Cl.⁷ .............................................. B65D 85/30
(52) U.S. Cl. ........................................ 206/714; 206/722
(58) Field of Search .............................. 206/713, 714, 206/716, 717, 718, 722, 724, 725, 726, 514

(56) References Cited

U.S. PATENT DOCUMENTS

| | | | | | |
|---|---|---|---|---|---|
| 5,418,692 A | * | 5/1995 | Nemoto | ...................... | 361/809 |
| 5,499,717 A | * | 3/1996 | Hayashi | ...................... | 206/701 |
| 5,957,293 A | * | 9/1999 | Pakeriasamy | ............... | 206/725 |
| 5,964,353 A | * | 10/1999 | Hamlin | ...................... | 206/714 |
| 6,179,127 B1 | * | 1/2001 | Kato et al. | .................. | 206/714 |
| 6,264,037 B1 | * | 7/2001 | Maston, III et al. | ........ | 206/725 |
| 6,357,595 B2 | * | 3/2002 | Sembonmatsu et al. | .... | 206/726 |
| 6,375,408 B1 | * | 4/2002 | Carter | ........................ | 414/810 |

\* cited by examiner

*Primary Examiner*—Shian T. Luong
(74) *Attorney, Agent, or Firm*—Rabin & Berdo, P.C.

(57) ABSTRACT

An embossed carrier tape includes a plurality of device pockets (device holes) in which electronic devices are held one by one; and support portions each of which is formed at a surrounding area of each of the device pockets. The support portions are of step-shaped on which the electronic devices are put and supported.

31 Claims, 9 Drawing Sheets

EMBOSSED CARRIER TAPE FOR ELECTRONIC DEVICES

CROSS REFERENCE TO RELATED APPLICATION

This application claims the priority of Application No. 2000-209195, filed Jul. 11, 2000 in Japan, the subject matter of which is incorporated herein by reference.

TECHNICAL FIELD OF THE INVENTION

The present invention relates to an embossed carrier tape for holding and packaging small-sized electronic devices such as a semiconductor device, a capacitor, a resistor, etc.

BACKGROUND OF THE INVENTION

An embossed carrier tape is generally used to hold and package small-sized electronic devices such as a semiconductor device, a capacitor, a resistor, etc. A conventional embossed carrier tape includes a plurality of device pockets (device holes) in which electronic devices are put one by one. Each of the device pockets (device holes) is shaped to be a reverse quadrangular pyramid having an inner side surface and a bottom surface. The inner side surfaces are sloped so that an electronic device is easily set in the device pocket.

According to the conventional embossed carrier tape, if an electronic device is inclined in the device pocket, terminals provided on the bottom of the electronic device are in contact with the inside surfaces of the device pocket. And therefore, the terminals may be deformed. Further, in order to treat different types of electronic devices, different shape of embossed carrier tapes are required.

OBJECTS OF THE INVENTION

Accordingly, an object of the present invention is to provide an embossed carrier tape in which electronic devices are held in appropriate attitude or posture.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, an embossed carrier tape used for holding and carrying electronic devices, includes a plurality of device pockets (device holes) in which electronic devices are held one by one; and support portions each of which is formed at a surrounding area of each of the device pockets. The support portions are of step-shaped on which the electronic devices are put and supported.

According to a second aspect of the present invention, an embossed carrier tape includes first type of device pockets (device holes) in which electronic devices are held one by one; and second type of device pockets (device holes) in which electronic devices are held one by one. The first and second types of device pockets are formed on front surface and rear surface of the embossed carrier tape, respectively.

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

First Preferred Embodiment

Figure 1:
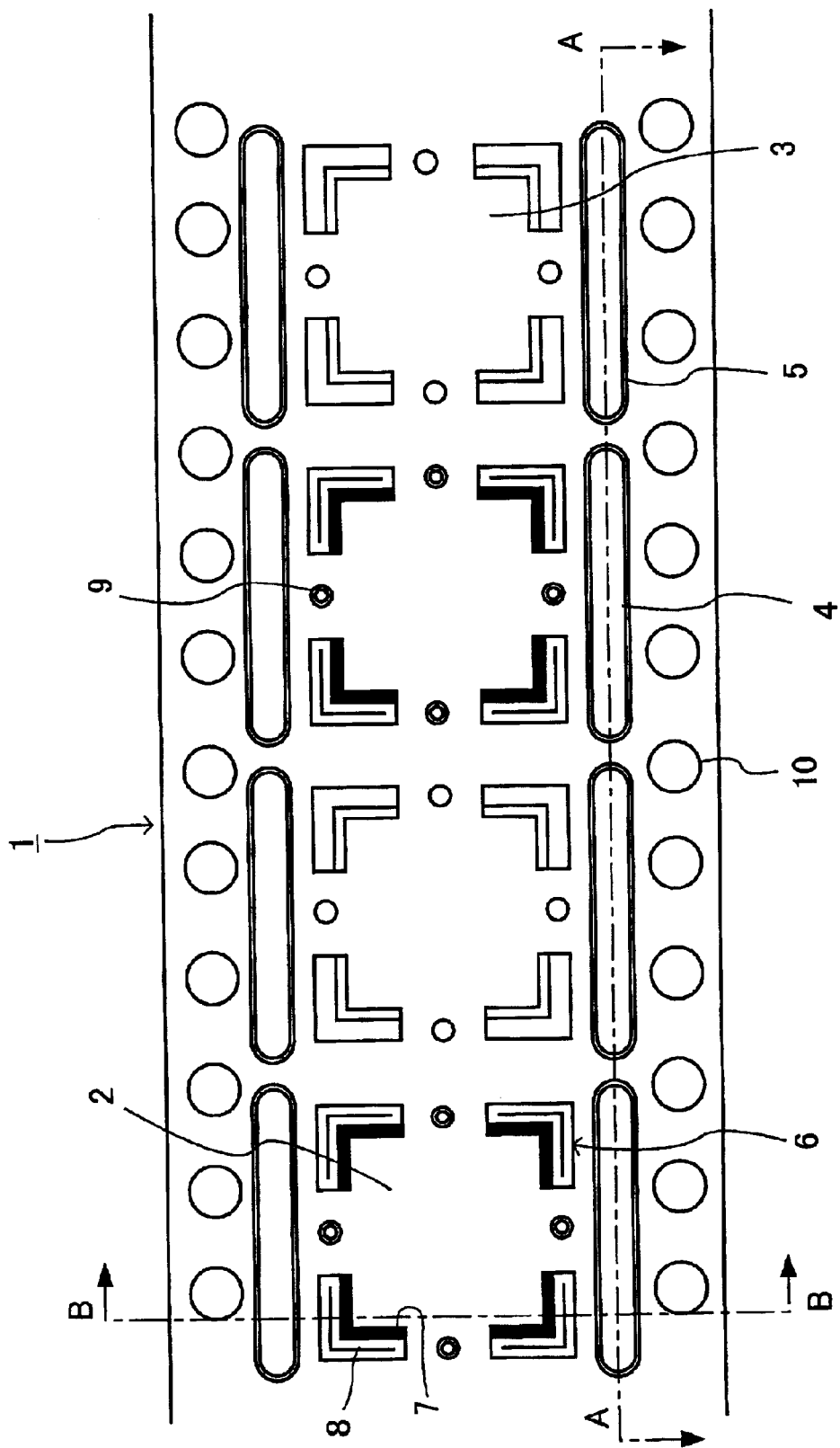
FIG. 1 is a plan view showing a part of an embossed carrier tape according to a first preferred embodiment of the present invention.
Figure 2:
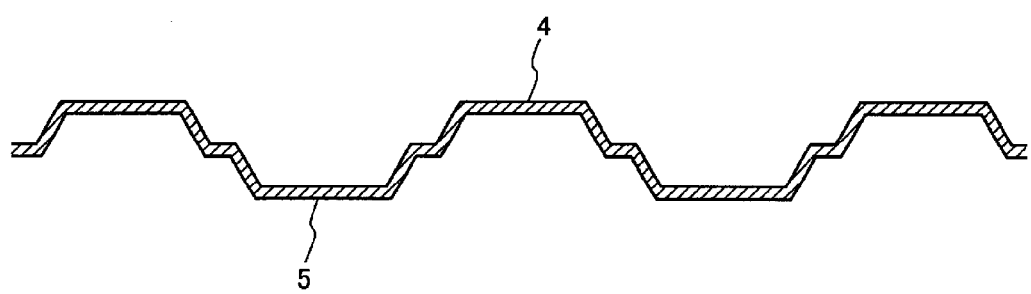
FIG. 2 is a cross-sectional view taken on line A—A in FIG. 1.
Figure 3:
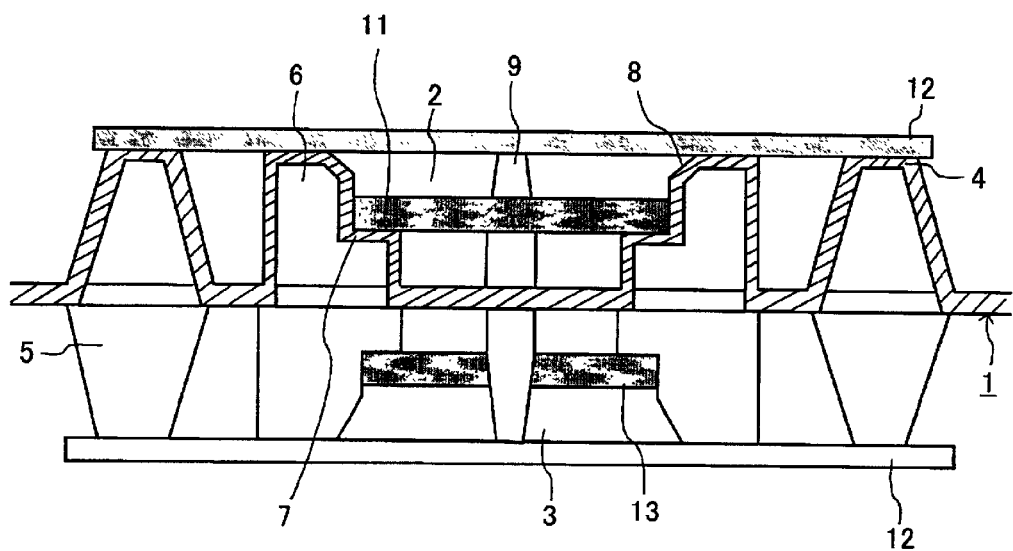
FIG. 3 is a cross-sectional view taken on line B—B in FIG. 1.

FIG. 1 is a plan view showing a part of an embossed carrier tape according to a first preferred embodiment of the present invention. FIGS. 2 and 3 are cross-sectional views taken on line A—A and B—B in FIG. 1, respectively. An embossed carrier tape 1 according to the first preferred embodiment includes a plurality of device pockets (device holes) 2 and 3 in which electronic devices are held (contained). The device pockets 2 and 3 are formed on the opposite surfaces of the embossed carrier tape 1, and are shaped to be the same. The shapes of the device pockets 2 and 3 may be different from each other in accordance with the types of electronic devices to be contained therein. The device pockets 2 and 3 are arranged alternately, but are arranged in another manner.

The embossed carrier tape 1 further includes cover-tape sealing portions 4 and 5, which are projected from the tape 1 and are arranged at the both sides of the device pockets 2 and 3. The convex portions 4 and 5 are formed in an embossing process. In the drawings of FIG. 1, the cover-tape sealing portions 4 are projected or convex while the cover-tape sealing portions 5 are depressed or concaved. Cover tapes, not shown, are put on the cover-tape sealing portions 4 and 5 to seal electronic devices contained in the device pockets 2 and 3, so that the electronic devices are well protected.

Each of the device pockets 2 and 3 is provided at corners with corner ribs 6. Each of the corner ribs 6 includes a device support portion 7, supporting an electronic device thereon, and a slope portion 8. Since each of the corner ribs 6 is provided with the slope portion 8, an electronic device is easily put into the device pockets 2 and 3.

Between adjacent two corner ribs 6, a guide pin 9 is formed. The guide pin 9 extends vertically from the carrier tape 1 to guide an electronic device to be put into the device pocket 2 or 3. The embossed carrier tape 1 further includes sprocket holes 10 which are used for carrying the embossed carrier tape 1 in the longitudinal direction.

FIG. 2 shows the cover-tape sealing portions 4 and 5. The cover-tape sealing portions 4 and 5 are arranged on the front and reverse surfaces, respectively, and are shaped to be the same.

Now referring to FIG. 3, since each of the corner ribs 6 is provided with the slope portion 8 and the embossed carrier tape 1 includes the guide pins 9, an electronic device 11 can be easily put into the device pocket 2. Further, according to the first preferred embodiment, the electronic devices 11 are stably held in the device pockets 2, because each of the corner ribs 6 is provided with the support portion 7 that is formed to be stepped shape or level-difference shape. The device pockets 3 hold electronic devices 13 in the same manner as the device pockets 2.

Figure 4:
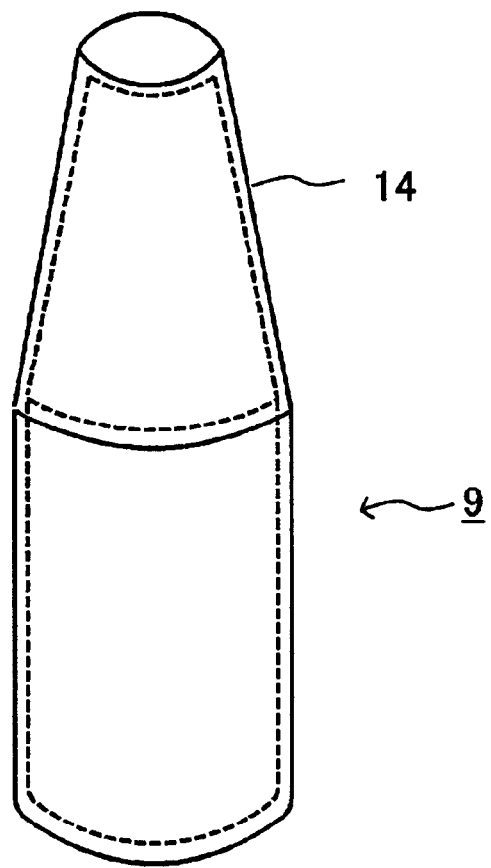
FIG. 4 is a perspective view showing a guide pin for the embossed carrier tape, shown in FIG. 1.

Referring to FIG. 4, the guide pin 9 is formed to be hollow and to have a slope portion 14 at an upper part. Since each of the guide pins 9 is provided with the slope portion 14, the electronic devices can be easily guided and put into the device pockets 2 and 3. The corner ribs 6, guide pins 9 are formed integrally with the embossed carrier tape 1 in an embossing process.

In operation, first the electronic devices 11 are guided by the slope portions 14 of the guide pins 9 and the slope portions 8 of the corner ribs 6 and are put into the device pockets 2, formed on the front surface of the embossed carrier tape 1. The electronic devices 11 are supported by the support portions 7 of the corner ribs 6.

After that, a cover tape 12 is adhered at the cover-tape sealing portions 4 so that the electronic devices 11 contained in the device pockets 2 are sealed with the cover tape 12. Next, the embossed carrier tape 1 containing the electronic devices 11 are wound around a reel, not shown.

Subsequently, the reel is set in the system so that the rear (reverse) surface of the embossed carrier tape 1 faces up, then the embossed carrier tape 1 is wound back while the electronic devices 13 are set in the device pockets 3 formed on the rear surface of the embossed carrier tape 1. Next, a cover tape 12 is adhered at the cover-tape sealing portions 5 so that the electronic devices 13 contained in the device pockets 3 are sealed with the cover tape 12. After that, the embossed carrier tape 1 containing both the electronic devices 11 and 13 are wound around another reel.

In the first preferred embodiment, the device pockets 2 and 3 may be formed to be different in shape so that different types of electronic devices are contained in the carrier tape 1.

As described above, according to the first preferred embodiment of the present invention, the embossed carrier tape 1 includes the corner ribs 6 with slope portions 8 and guide pins 9 with slope portions 14, so that electronic devices can be guided and contained reliably in the device pockets 2 and 3 without inclination.

Since the embossed carrier tape 1 includes the device pockets 2 and 3 on the both surface, different types of electronic devices can be contained in the same carrier tape. Consequently, costs for embossed carrier tapes can be reduced.

Further, according to the first preferred embodiment, the electronic devices are supported with the support portions 7 of the corner ribs 6. Therefore, some space is made around the electronic devices, and dust etc. stuck on the rear bottom surface of the electronic device can be removed and exhausted out easily.

Second Preferred Embodiment

Figure 5:
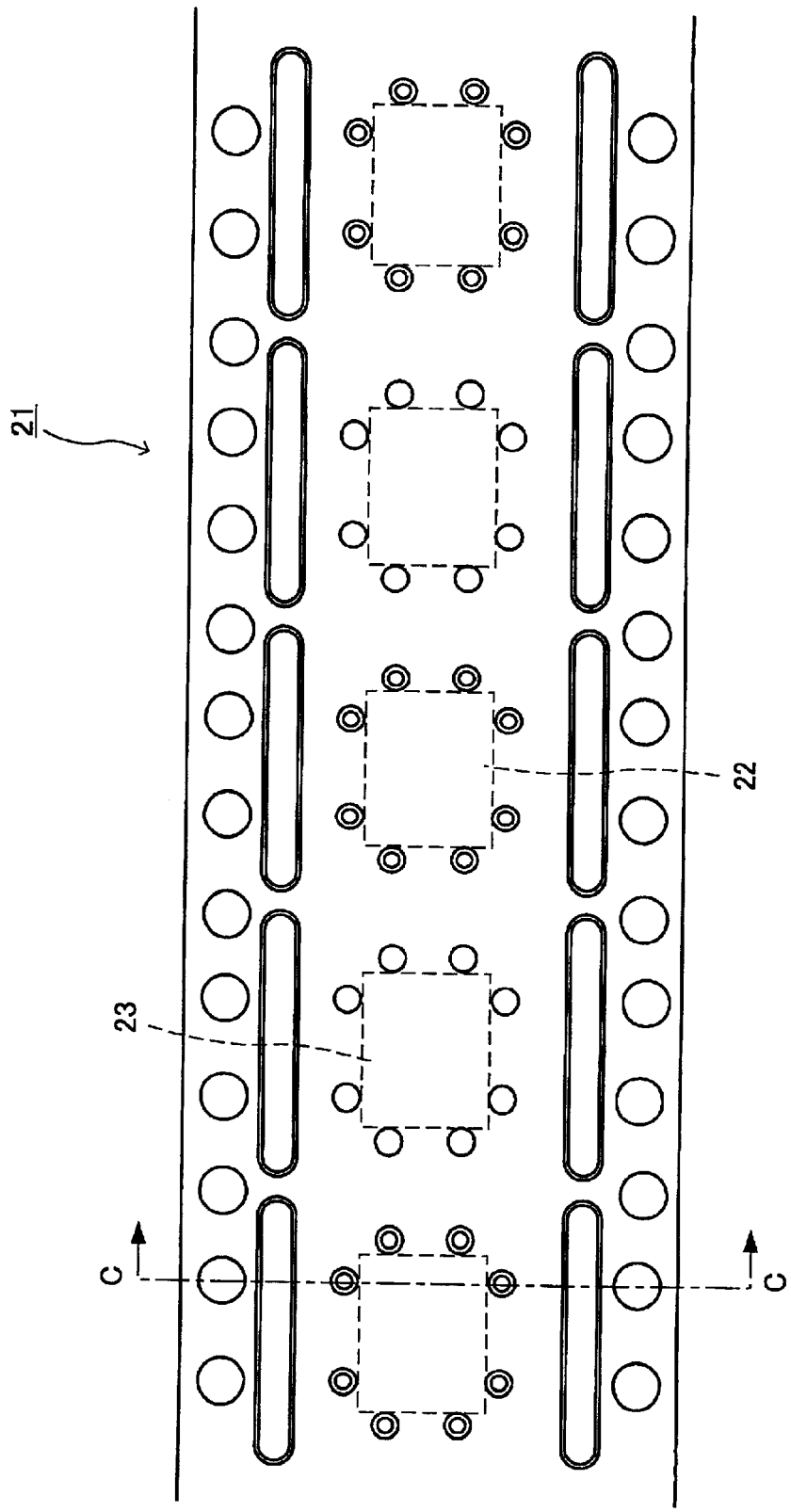
FIG. 5 is a plan view showing a part of an embossed carrier tape according to a second preferred embodiment of the present invention.
Figure 6:
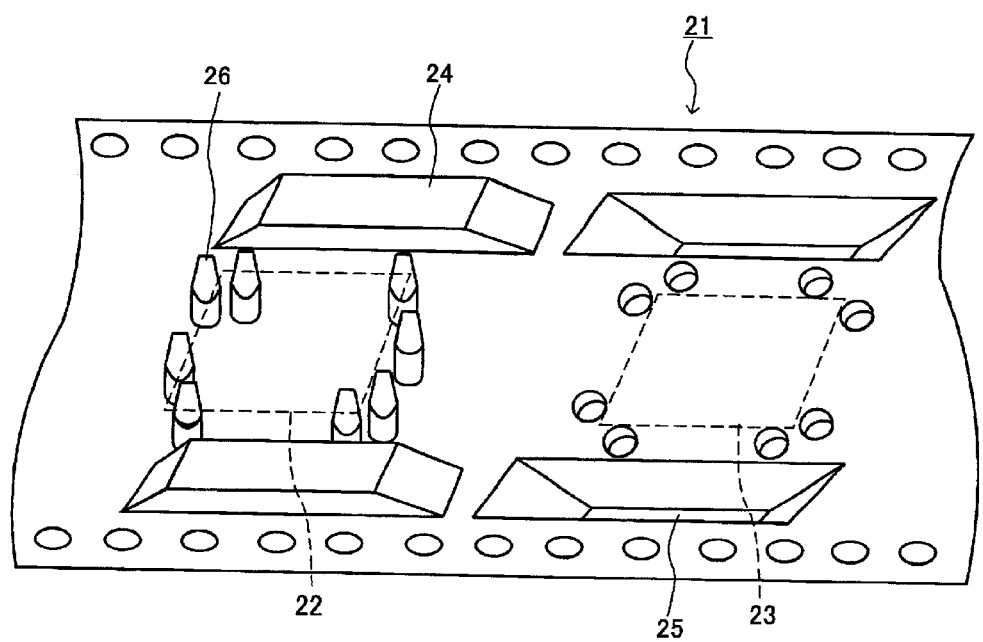
FIG. 6 is a perspective view showing a part of the embossed carrier tape, shown in FIG. 5.
Figure 7:
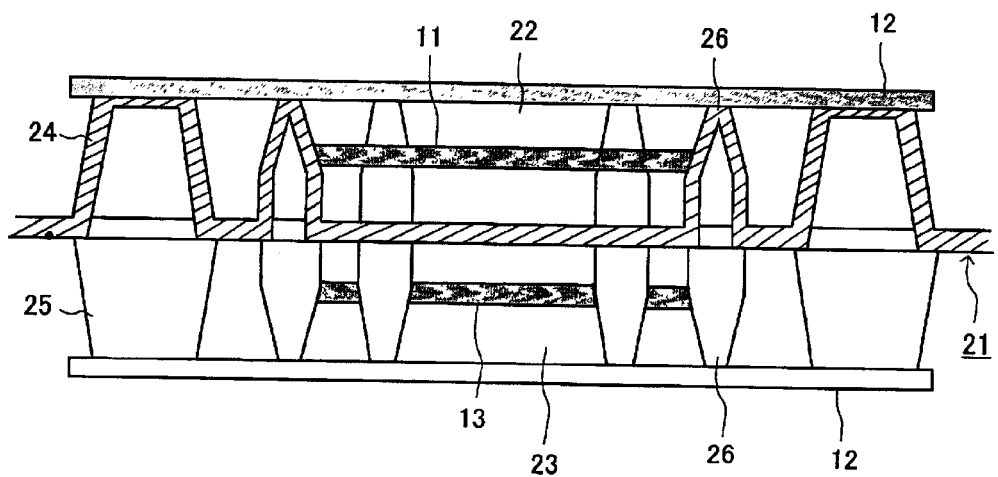
FIG. 7 is a cross-sectional view taken on line C—C in FIG. 5.
Figure 8:
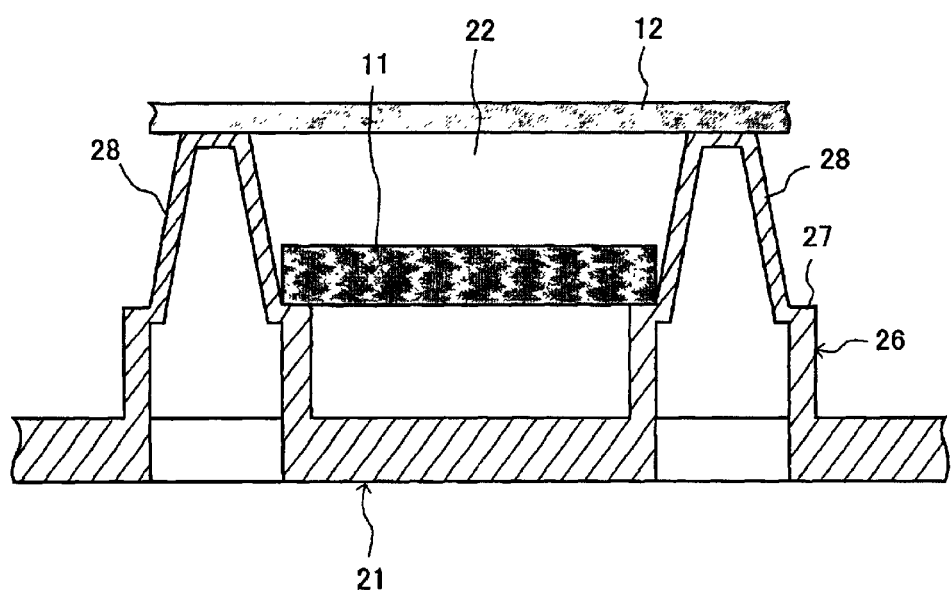
FIG. 8 is a cross-sectional view showing the structure of a pocket rib for the embossed carrier tape, shown in FIG. 5.

FIG. 5 is a plan view showing a part of an embossed carrier tape according to a second preferred embodiment of the present invention. FIG. 6 is a perspective view showing a part of the embossed carrier tape, shown in FIG. 5. FIG. 7 is a cross-sectional view taken on line C—C in FIG. 5. FIG. 8 is a cross-sectional view showing the structure of a pocket rib for the embossed carrier tape, shown in FIG. 5.

An embossed carrier tape 21 according to the second preferred embodiment includes a plurality of device pockets (device holes) 22 and 23 in which electronic devices are held (contained). The device pockets 22 and 23 are formed on the opposite surfaces of the embossed carrier tape 21, and are shaped to be the same. The shapes of the device pockets 22 and 23 may be different from each other in accordance with the types of electronic devices to be contained therein. The device pockets 22 and 23 are arranged alternately, but are arranged in another manner.

The embossed carrier tape 21 further includes cover-tape sealing portions 24 and 25, which are projected from the tape 21 and are arranged at the both sides of the device pockets 22 and 23. The convex portions 24 and 25 are formed in an embossing process. As shown in FIG. 6, the cover-tape sealing portions 24 are projected or convex while the cover-tape sealing portions 25 are depressed or concaved. Cover tapes, not shown, are put on the cover-tape sealing portions 24 and 25 to seal electronic devices contained in the device pockets 22 and 23, so that the electronic devices are well protected.

Each of the device pockets 22 and 23 is provided at corners with pocket ribs 26. Two of the pocket ribs 26 are arranged at the both sides of each corner of the device pockets 22 and 23. Each of the pocket ribs 26 includes a device support portion 27, supporting an electronic device thereon, and a slope portion 28. Since each of the pocket ribs 26 is provided with the slope portion 28, an electronic device is easily put into the device pockets 22 and 23. The pocket ribs 26 are formed integrally with the carrier tape 21 in an embossing process to extend and project vertically from the carrier tape 21. Each of the pocket ribs 26 is formed to be hollow. The support portions 27 are for supporting electronic devices thereon stably. The slope portions 28 are for guiding the electronic devices into the device pockets 22 and 23.

The embossed carrier tape 21 further includes sprocket holes at around the side edges thereof, which are used for carrying the embossed carrier tape 21 in the longitudinal direction.

The cover-tape sealing portions 24 and 25 are arranged on the front and reverse surfaces of the embossed carrier tape 21, respectively, and are shaped to be the same.

In operation, first the electronic devices 11 are guided by the slope portions 28 of the pocket ribs 26 and are put into the device pockets 22, formed on the front surface of the embossed carrier tape 21. The electronic devices 11 are supported by the support portions 27 of the pocket ribs 26.

After that, a cover tape 12 is adhered at the cover-tape sealing portions 24 so that the electronic devices 11 contained in the device pockets 22 are sealed with the cover tape 12. Next, the embossed carrier tape 21 containing the electronic devices 11 are wound around a reel, not shown.

Subsequently, the reel is set in the system so that the rear (reverse) surface of the embossed carrier tape 21 faces up, then the embossed carrier tape 21 is wound back while the electronic devices 13 are set in the device pockets 23 formed on the rear surface of the embossed carrier tape 21. Next, a cover tape 12 is adhered at the cover-tape sealing portions 25 so that the electronic devices 13 contained in the device pockets 23 are sealed with the cover tape 12. After that, the embossed carrier tape 21 containing both the electronic devices 11 and 13 are wound around another reel.

In the second preferred embodiment, the device pockets 22 and 23 may be formed to be different in shape so that different types of electronic devices are contained in the carrier tape 21.

As described above, according to the second preferred embodiment of the present invention, the embossed carrier tape 21 includes the pocket ribs 26 with slope portions 28, so that electronic devices can be guided and contained reliably in the device pockets 22 and 23 without inclination.

Since the embossed carrier tape 21 includes the device pockets 22 and 23 on the both surface, different types of electronic devices can be contained in the same carrier tape. Consequently, costs for embossed carrier tapes can be reduced.

Further, according to the second preferred embodiment, the electronic devices are supported with the support portions 27 of the pocket ribs 26. Therefore, some space is made around the electronic devices, and dust etc. stuck on the rear bottom surface of the electronic device can be removed and exhausted out easily.

Third Preferred Embodiment

Figure 9:
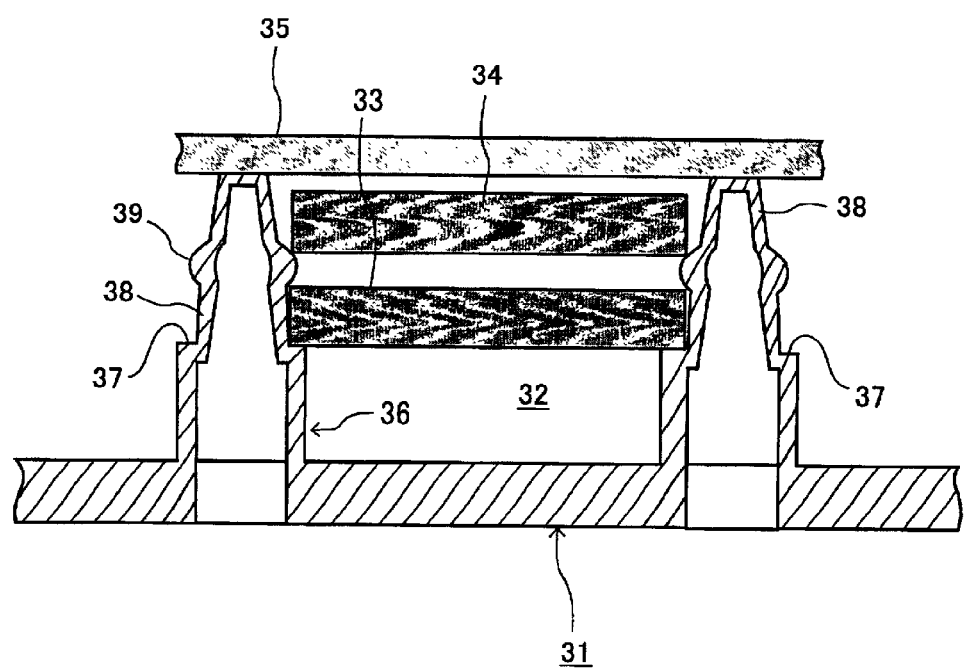
FIG. 9 is a cross-sectional view showing a part of an embossed carrier tape according to a third preferred embodiment of the present invention.

FIG. 9 is a cross-sectional view showing a part of an embossed carrier tape according to a third preferred embodiment of the present invention. An embossed carrier tape 31 according to the third preferred embodiment includes a plurality of device pockets (device holes) 32 in which electronic devices 33 and 34 are held (contained).

Each of the device pockets 32 is provided at corners with pocket ribs 36. Two of the pocket ribs 36 are arranged at the both sides of each corner of the device pockets 32. Each of the pocket ribs 36 includes a device support portion 37, supporting the electronic device 33 thereon, a slope portion 38 and a support rib 39. As shown in FIG. 9, the support portion 37 supports the electronic device 33 while the support rib 39 supports the other electronic device 34 above the device 33. In other words, the electronic device 33 and 34 are contained in the device pocket 32 in a two-level manner.

Since each of the pocket ribs 36 is provided with the slope portion 38, an electronic device is easily put into the device pockets 32. The pocket ribs 36 are formed integrally with the carrier tape 31 in an embossing process to extend and project vertically from the carrier tape 31. Each of the pocket ribs 36 is formed to be hollow.

In operation, first the electronic devices 33 are guided by the slope portions 38 of the pocket ribs 36 and are put into the device pockets 32 so that the device 33 are supported by the support portions 37. Subsequently, the electronic devices 34 are put into the device pockets 32 so that the devices 34 are supported by the support ribs 39. After that, a cover tape 35 is adhered at cover-tape sealing portions, not shown, so that the electronic devices 33 and 34 contained in the device pockets 32 are sealed with the cover tape 35.

In the third preferred embodiment, the device pockets 32 may be formed on the both surfaces of the embossed carrier tape 31 in the same manner as the first and second preferred embodiments. In this case, on one surface of the embossed carrier tape 31, each device pocket may contain a single device.

As described above, according to the third preferred embodiment of the present invention, the embossed carrier tape 31 includes the pocket ribs 36 with slope portions 38, so that electronic devices can be guided and contained reliably in the device pockets 32 without inclination. Since the electronic devices 33 and 34 are supported with the support portions 37 and support ribs 39 of the pocket ribs 36, some space is made around the electronic devices. And therefore, dust etc. stuck on the rear bottom surface of the electronic devices 33 and 34 can be removed and exhausted out easily. In addition, according to the third preferred embodiment, more number of electronic devices can be contained in one embossed carrier tape.

The present invention can be applied to an embossed carrier tape that holding BGA, CSP, QFP (Quad Flat Package), SOJ (Small Outline J-leaded Package), SOP (Small Outline Package) and the like by changing the shape of device pockets.

What is claimed is:

1. An embossed carrier tape, comprising:

a plurality of device pockets in which electronic devices are held;

support portions formed at a surrounding area of each of the device pockets, the support portions being step-shaped to receive and support the electronic devices; and guide pins arranged at a surrounding area of each of the device pockets to guide the electronic device to the support portions.

2. An embossed carrier tape according to claim 1, wherein the support portions are formed as parts of ribs, which are formed integrally with the embossed carrier tape.

3. An embossed carrier tape according to claim 2, wherein each of the ribs comprises a slope portion so that the electronic device is easily put on the support portion.

4. An embossed carrier tape according to claim 2, wherein the ribs are L-shaped and are arranged at corners of the device pockets.

5. An embossed carrier tape according to claim 4, wherein each of the guide pins is arranged between a pair of the ribs.

6. An embossed carrier tape according to claim 2, wherein each of the ribs comprises two support portions arranged at upper and lower positions in a vertical direction to support two electronic devices in each of the device pockets.

7. An embossed carrier tape according to claim 1, wherein the guide pins are formed integrally with the embossed carrier tape.

8. An embossed carrier tape according to claim 1, wherein each of the guide pins comprises a slope portion so that the electronic device is easily put into the device pocket.

9. An embossed carrier tape, comprising:

a plurality of first device pockets in which electronic devices are held; and a plurality of second device pockets in which electronic devices are held, wherein the first and second device pockets are formed on a front side and rear side of the embossed carrier tape, respectively, and wherein the first and second device pockets have shapes that are the same in order to hold electronic devices having a common shape.

10. An embossed carrier tape, comprising:

a plurality of first device pockets in which electronic devices are held; and a plurality of second device pockets in which electronic devices are held, wherein the first and second device pockets are formed on a front side and rear side of the embossed carrier tape, respectively, and wherein the first and second device pockets are formed alternately in a longitudinal direction of the embossed carrier tape.

11. An embossed carrier tape according to claim 10 further comprising:

support portions formed at a surrounding area of each of the device pockets, the support portions being step-shaped to receive and support the electronic devices.

12. An embossed carrier tape according to claim 11, further comprising:

guide pins arranged at a surrounding area of each of the device pockets to guide the electronic device to the support portions.

13. An embossed carrier tape according to claim 12, wherein the guide pins are formed integrally with the embossed carrier tape.

14. An embossed carrier tape according to claim 12, wherein each of the guide pins comprises a slope portion so that the electronic device is easily put into the device pocket.

15. An embossed carrier tape according to claim 11, wherein the support portions are formed as parts of ribs, which are formed integrally with the embossed carrier tape.

16. An embossed carrier tape according to claim 15, wherein each of the ribs comprises a slope portion so that the electronic device is easily put on the support portion.

17. An embossed carrier tape according to claim 15, wherein the ribs are L-shaped and are arranged at corners of the device pockets.

18. An embossed carrier tape according to claim 17, wherein each of the guide pins is arranged between a pair of the ribs.

19. An embossed carrier tape according to claim 15, wherein each of the ribs comprises two support portions arranged at upper and lower positions in a vertical direction to support two electronic devices in each of the device pockets.

20. An embossed carrier tape which extends in a length direction, comprising:

a plurality of first device pockets in which electronic devices are held; and a plurality of second device pockets in which electronic devices are held, wherein the first and second device pockets are formed on a front side and rear side of the embossed carrier tape, respectively, and wherein the first device pockets are offset from the second device pockets in the length direction of the embossed carrier tape and do not overlap.

21. An embossed carrier tape according to claim 20, wherein the first and second device pockets have shapes that are the same in order to hold electronic devices having a common shape.

22. An embossed carrier tape according to claim 20, wherein the first and second device pockets are formed integrally with the embossed carrier tape.

23. An embossed carrier tape according to claim 20, wherein the first and second device pockets alternate in the length direction of the embossed carrier tape.

24. An embossed carrier tape according to claim 20, further comprising:

support portions formed at a surrounding area of each of the device pockets, the support portions being step-shaped to receive and support the electronic devices.

25. An embossed carrier tape according to claim 24, wherein the support portions are formed as parts of ribs, which are formed integrally with the embossed carrier tape.

26. An embossed carrier tape according to claim 25, wherein each of the ribs comprises a slope portion so that the electronic device is easily put on the support portion.

27. An embossed carrier tape according to claim 25, wherein the ribs are L-shaped and are arranged at corners of the device pockets.

28. An embossed carrier tape according to claim 24, further comprising:

guide pins arranged at a surrounding area of each of the device pockets to guide the electronic device to the support portions.

29. An embossed carrier tape according to claim 28, wherein the guide pins are formed integrally with the embossed carrier tape.

30. An embossed carrier tape according to claim 28, wherein each of the guide pins comprises a slope portion so that the electronic device is easily put into the device pocket.

31. An embossed carrier tape according to claim 28, wherein each of the guide pins is arranged between a pair of the ribs.

* * * * *